(12) United States Patent
Kobinata et al.

(10) Patent No.: US 11,646,328 B2
(45) Date of Patent: May 9, 2023

(54) IMAGING DEVICE

(71) Applicant: PANASONIC INTELLECTUAL PROPERTY MANAGEMENT CO., LTD., Osaka (JP)

(72) Inventors: Kyosuke Kobinata, Osaka (JP); Sanshiro Shishido, Osaka (JP); Yoshihiro Sato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 155 days.

(21) Appl. No.: 17/039,018

(22) Filed: Sep. 30, 2020

(65) Prior Publication Data

US 2021/0013252 A1 Jan. 14, 2021

Related U.S. Application Data

(63) Continuation of application No. 16/034,328, filed on Jul. 12, 2018, now Pat. No. 10,825,846.

(30) Foreign Application Priority Data

Jul. 25, 2017 (JP) .............................. JP2017-144023

(51) Int. Cl.
*H01L 27/146* (2006.01)
*H01L 31/0224* (2006.01)
(Continued)

(52) U.S. Cl.
CPC .. *H01L 27/14605* (2013.01); *H01L 27/14603* (2013.01); *H01L 27/14612* (2013.01);
(Continued)

(58) Field of Classification Search
CPC ......... H01L 27/14665; H01L 27/14643; H01L 27/14603
See application file for complete search history.

(56) References Cited

U.S. PATENT DOCUMENTS

2005/0225655 A1   10/2005  Suzuki
2014/0151531 A1   6/2014   Yamashita
(Continued)

FOREIGN PATENT DOCUMENTS

JP   2005-286104 A   10/2005
JP   2011-238781 A   11/2011
(Continued)

OTHER PUBLICATIONS

The Extended European Search Report dated Jan. 25, 2019 for the related European Patent Application No. 18185024.9.
(Continued)

*Primary Examiner* — Julio J Maldonado
*Assistant Examiner* — Stanetta D Isaac
(74) *Attorney, Agent, or Firm* — McDermott Will & Emery LLP

(57) ABSTRACT

An imaging device including a semiconductor substrate; a first pixel including a first photoelectric converter configured to convert incident light into charge, and a first diffusion region in the semiconductor substrate, configured to electrically connected to the first photoelectric converter and a second pixel including a second photoelectric converter, configured to convert incident light into charge, and a second diffusion region in the semiconductor substrate, configured to electrically connected to the second photoelectric converter, wherein an area of the first photoelectric converter is greater than an area of the second photoelectric converter in a plan view, both the first diffusion region and
(Continued)

the second diffusion region overlap with the first photoelectric converter in the plan view, and neither the first diffusion region nor the second diffusion region overlaps with the second photoelectric converter in the plan view.

13 Claims, 9 Drawing Sheets

(51) Int. Cl.
    *H04N 5/378*     (2011.01)
    *H04N 5/353*     (2011.01)
    *H04N 5/374*     (2011.01)
    *H04N 5/357*     (2011.01)

(52) U.S. Cl.
    CPC .. *H01L 27/14623* (2013.01); *H01L 27/14636* (2013.01); *H01L 27/14643* (2013.01); *H01L 27/14665* (2013.01); *H01L 31/022408* (2013.01); *H04N 5/353* (2013.01); *H04N 5/357* (2013.01); *H04N 5/374* (2013.01); *H04N 5/378* (2013.01)

(56) References Cited

U.S. PATENT DOCUMENTS

2014/0347538 A1    11/2014    Toda
2016/0360134 A1    12/2016    Miyake

FOREIGN PATENT DOCUMENTS

| JP | 2011-243704 A | 12/2011 |
| JP | 2016-076921 A | 5/2016 |
| JP | 2017-005051 A | 1/2017 |
| WO | 2011/145153 A1 | 11/2011 |

OTHER PUBLICATIONS

Non-Final Office Action issued in U.S. Appl. No. 16/034,328, dated Oct. 22, 2019.
Final Office Action issued in U.S. Appl. No. 16/034,328, dated Mar. 4, 2020.
Notice of Allowance issued in U.S. Appl. No. 16/034,328, dated Jun. 30, 2020.
Chinese Search Report dated Jan. 3, 2023 for the related Chinese Patent Application No. 201810573429.8.

IMAGING DEVICE

CROSS-REFERENCE OF RELATED APPLICATIONS

This application is a Continuation of the U.S. patent application Ser. No. 16/034,328, filed on Jul. 12, 2018, which claims the benefit of Japanese Application No. 2017-144023, filed on Jul. 25, 2017, the entire disclosures of which Applications are incorporated by reference herein.

BACKGROUND

1. Technical Field

The present disclosure relates to an imaging device.

2. Description of the Related Art

Subjects that are present in the natural world have a wide dynamic range. For example, in an in-vehicle use, the brightness of a subject changes moment by moment, and therefore simultaneous imaging of bright subjects and dark subjects, what is known as high dynamic range imaging, is required. Japanese Unexamined Patent Application Publication No. 2016-076921, for example, discloses an imaging device that is capable of high dynamic range imaging with no time difference by combining images simultaneously captured by two pixels having different sensitivity.

Furthermore, the global shutter method is a technique for capturing an object moving at high speed. With a CMOS (complementary metal oxide semiconductor) solid-state imaging device that employs the global shutter method, image quality deteriorates if light is incident on a charge accumulation region when the shutter is not open. This is because the incident light is subjected to photoelectric conversion in the charge accumulation region, and the generated charge becomes a false signal. Japanese Unexamined Patent Application Publication No. 2011-238781, for example, discloses a solid-state imaging element which has photoelectric conversion units having an upper electrode, a lower electrode, and a photoelectric conversion film interposed therebetween, in which a light-shielding film configured from a black resist material is provided between adjacent lower electrodes. The solid-state imaging element disclosed in Japanese Unexamined Patent Application Publication No. 2011-238781 suppresses light being incident on a charge accumulation region by means of the light-shielding film.

SUMMARY

In an imaging device, it is desirable that the leakage of light into a charge accumulation region be reduced for deterioration in image quality to be suppressed.

In one general aspect, the techniques disclosed here feature an imaging device including a semiconductor substrate; a first pixel including a first photoelectric converter configured to convert incident light into charge, and a first diffusion region in the semiconductor substrate, configured to electrically connected to the first photoelectric converter and a second pixel including a second photoelectric converter, configured to convert incident light into charge, and a second diffusion region in the semiconductor substrate, configured to electrically connected to the second photoelectric converter, wherein an area of the first photoelectric converter is greater than an area of the second photoelectric converter in a plan view, both the first diffusion region and the second diffusion region overlap with the first photoelectric converter in the plan view, and neither the first diffusion region nor the second diffusion region overlaps with the second photoelectric converter in the plan view.

General or specific aspects may be realized by means of an element, a device, a module, a system, an integrated circuit, or a method. Furthermore, general or specific aspects may be realized by means of an arbitrary combination of an element, a device, a module, a system, an integrated circuit, and a method.

Additional benefits and advantages of the disclosed embodiments will be apparent from the specification and figures. The benefits and/or advantages may be individually provided by the various embodiments or features disclosed in the specification and figures, and need not all be provided in order to obtain one or more of the same.

Figure 1:
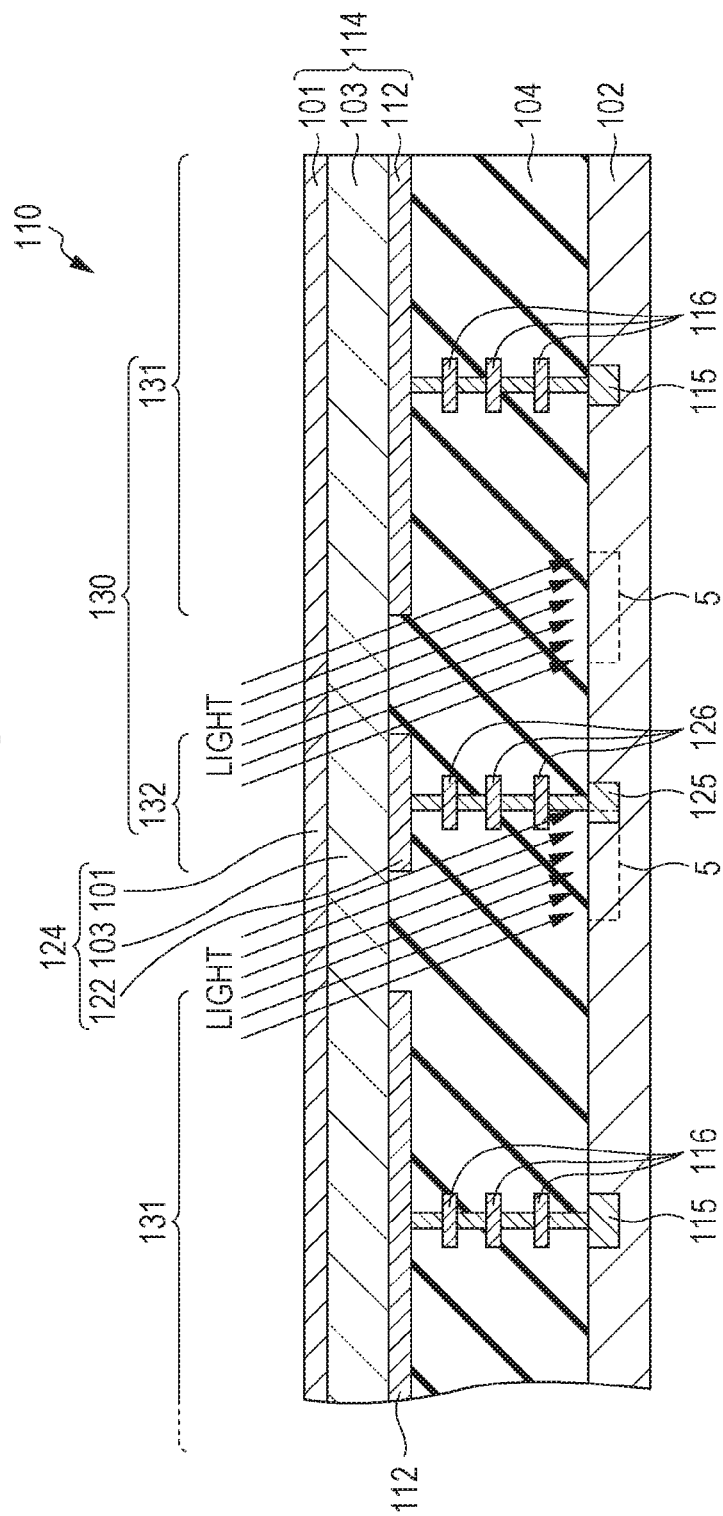
FIG. 1 is a schematic cross-sectional view of an imaging device according to a reference example.

DETAILED DESCRIPTION (Underlying Knowledge Forming Basis of the Present Disclosure)

A stacked CMOS sensor has a photoelectric conversion layer above a semiconductor substrate. In a stacked CMOS sensor, in order to realize high dynamic range imaging and perform imaging of objects moving at high speed, it is desirable for a unit pixel to be configured from two pixel cells having different sensitivities and for the global shutter method to be used. However, as mentioned above, in an imaging device that employs the global shutter method, if light is incident on a charge accumulation region when the shutter is not open, there is a possibility of the image quality deteriorating due to photoelectric conversion occurring in the charge accumulation region and the generated charge becoming a false signal. Therefore, a scheme for reducing the leakage of light into a charge accumulation region is required. It should be noted that this kind of light reception sensitivity to light that leaks in when the shutter is not open is referred to as parasitic light reception sensitivity. Furthermore, parasitic light reception sensitivity is also referred to as PLS (parasitic light sensitivity) and parasitic sensitivity.

The leakage of light into a charge accumulation region occurs due to incident light that has not been absorbed by the photoelectric conversion layer being incident on a lower layer from a gap between lower electrodes (also referred to as pixel electrodes). When viewed from the direction perpendicular to the semiconductor substrate, it is easier for light to hit regions in positions that are nearer a gap between lower electrodes, and it is more difficult for light to hit regions that are nearer the central section of a lower electrode. Therefore, in Japanese Unexamined Patent Application Publication No. 2011-238781, charge accumulation regions are arranged in regions that are near the central sections of the lower electrodes in plan view.

However, in the configuration of Japanese Unexamined Patent Application Publication No. 2016-076921, a unit pixel is provided with two lower electrodes having different areas, and charge accumulation regions are arranged in such a way as to overlap with the respective lower electrodes in plan view. Light leaked from a gap between the lower electrodes is more likely to enter a charge accumulation region overlapping, in plan view, with the lower electrode with a smaller area than a charge accumulation region overlapping, in plan view, with the lower electrode with a larger area. Therefore, the configuration of Japanese Unexamined Patent Application Publication No. 2016-076921 has a problem in that leaked light is incident on one of the charge accumulation regions and photoelectric conversion thereby occurs in the charge accumulation region, in other words, parasitic light reception sensitivity increases.

Hereinafter, problems with an imaging device according to a reference example in which the configuration of the present disclosure has not been applied will be described. In the imaging device according to the reference example, a unit pixel is configured from two pixel cells having different sensitivities, and the global shutter method is employed.

FIG. 1 is a schematic cross-sectional view of an imaging device 110 according to the reference example.

The imaging device 110 has a plurality of pixels 130. Each of the plurality of pixels 130 has a first pixel cell 131 and a second pixel cell 132 that is different from the first pixel cell 131.

The first pixel cell 131 is provided with a first photoelectric conversion unit 114 and a first charge accumulation region 115. The first photoelectric conversion unit 114 is provided with an upper electrode 101, a second electrode 112 that opposes the upper electrode 101, and a photoelectric conversion layer 103 that is arranged between the upper electrode 101 and the second electrode 112 and converts incident light into charge. The first charge accumulation region 115 is electrically connected to the second electrode 112 via wiring layers 116. Furthermore, the first charge accumulation region 115 is formed within a semiconductor substrate 102.

Furthermore, the second pixel cell 132 is provided with a second photoelectric conversion unit 124 and a second charge accumulation region 125. The second photoelectric conversion unit 124 is provided with the upper electrode 101, a fourth electrode 122 that opposes the upper electrode 101, and the photoelectric conversion layer 103 that is arranged between the upper electrode 101 and the fourth electrode 122 and converts incident light into charge. The area of the fourth electrode 122 is smaller than that of the second electrode 112. The second charge accumulation region 125 is electrically connected to the fourth electrode 122 via wiring layers 126. Furthermore, the second charge accumulation region 125 is formed within the semiconductor substrate 102.

As depicted in FIG. 1, in the imaging device 110 according to the reference example, the first charge accumulation region 115 has been arranged in such a way as to be superposed with the central section of the second electrode 112 of the first pixel cell 131 in plan view. Furthermore, the second charge accumulation region 125 has been arranged in such a way as to be superposed with the central section of the fourth electrode 122 in plan view.

The second electrode 112 and the fourth electrode 122, which are pixel electrodes, are configured from a metal having strong light-shielding properties such as titanium (Ti) or aluminum (Al), for example. Therefore, in a case where light that has been incident on the photoelectric conversion layer 103 has hit the second electrode 112 and the fourth electrode 122, the light does not pass through these electrodes and therefore does not reach the semiconductor substrate 102. However, in a case where incident light that has leaked into an interlayer insulation layer 104 from between the second electrode 112 and the fourth electrode 122 has entered the furthest regions below the second electrode 112 and the fourth electrode 122, for example, the incident light reaches the regions of the semiconductor substrate 102 enclosed by dotted lines in FIG. 1. In this way, when incident light that has leaked into the interlayer insulation layer 104 from between the second electrode 112 and the fourth electrode 122 reaches the semiconductor substrate 102, the regions where the incident light hits are referred to as light-receiving regions 5 of the semiconductor substrate 102. In this case, in FIG. 1, at the fourth electrode 122 that has a smaller area than the second electrode 112, a light-receiving region 5 partially overlaps with the second charge accumulation region 125 in plan view. That is, the light that has reached the light-receiving region 5 is incident on a portion of the second charge accumulation region 125. Photoelectric conversion therefore occurs in the second charge accumulation region 125 due to the incident light. That is, the parasitic light reception sensitivity of the second charge accumulation region 125 increases.

In an imaging device, it is desirable that the leakage of light into a charge accumulation region be reduced for deterioration in image quality to be suppressed.

The inventors of the present application conceived of an imaging device provided with a novel structure. An overview of an aspect of the present disclosure is as described in the following items.

An imaging device according to an aspect of the present disclosure is provided with: a semiconductor substrate; a first pixel including: a first photoelectric converter above the semiconductor substrate, including a first electrode, a second electrode facing the first electrode, and a first photoelectric conversion layer between the first electrode and the second electrode, configured to convert incident light into first charge; and a first charge accumulation region in the semiconductor substrate, electrically connected to the second electrode; and a second pixel including: a second photoelectric converter above the semiconductor substrate, including a third electrode, a fourth electrode facing the third electrode, and a second photoelectric conversion layer between the third electrode and the fourth electrode, configured to convert incident light into second charge; and a second charge accumulation region in the semiconductor substrate, electrically connected to the fourth electrode, wherein an area of the second electrode is greater than an area of the fourth electrode, and both the first charge accumulation region and the second charge accumulation region overlap with the second electrode in a plan view.

In this way, by arranging the first charge accumulation region and the second charge accumulation region in such a way as to be superposed with the second electrode having a large area in plan view, it becomes difficult for light that has leaked in from between the second electrode and the fourth electrode to be incident on the first charge accumulation region and the second charge accumulation region. It thereby becomes possible to reduce photoelectric conversion occurring with respect to leaked light in the first charge accumulation region and the second charge accumulation region, and to reduce parasitic light reception sensitivity. Deterioration in image quality can therefore be suppressed. For example, both an entire portion of the first charge accumulation region and an entire portion of the second charge accumulation region may overlap with the second electrode in the plan view.

For example, the first electrode and the third electrode may constitute a single electrode, and the first photoelectric conversion layer and the second photoelectric conversion layer may constitute a single photoelectric conversion layer.

The manufacturing process can thereby be simplified.

For example, neither the first charge accumulation region nor the second charge accumulation region may overlap with the fourth electrode in the plan view.

In this way, by arranging the first charge accumulation region and the second charge accumulation region in such a way as to not be superposed with the fourth electrode having a small area and to be superposed with the second electrode having a large area in plan view, it becomes difficult for light that has leaked in from between the second electrode and the fourth electrode to be incident on the first charge accumulation region and the second charge accumulation region. Thus, parasitic light reception sensitivity can be reduced, and deterioration in image quality can be suppressed.

For example, the first pixel may include a first diffusion region in the semiconductor substrate and a first transistor including a first source and a first drain, the first charge accumulation region functioning as one of the first source and the first drain, the first diffusion region functioning as the other of the first source and the first drain. The second pixel may include a second diffusion region in the semiconductor substrate and a second transistor including a second source and a second drain, the second charge accumulation region functioning as one of the second source and the second drain, the second diffusion region functioning as the other of the second source and the second drain. Both the first diffusion region and the second diffusion region may overlap with the second electrode in the plan view.

In this way, by arranging the first transistor and the second transistor in such a way as to be superposed with the second electrode having a large area in plan view, it becomes difficult for light that has leaked in from between the second electrode and the fourth electrode to hit the first transistor and the second transistor. It thereby becomes possible to reduce photoelectric conversion occurring in the first transistor and the second transistor, and to reduce parasitic light reception sensitivity. It therefore becomes possible to reduce noise that causes deterioration in image quality.

For example, neither the first diffusion region nor the second diffusion region may overlap with the fourth electrode in the plan view.

In this way, by arranging the other of the source and the drain of the first transistor and the second transistor in such a way as to not be superposed with the fourth electrode having a small area and to be superposed with the second electrode having a large area in plan view, it becomes possible to reduce photoelectric conversion occurring in the first transistor and the second transistor, and to reduce parasitic light reception sensitivity. It therefore becomes possible to reduce noise that causes deterioration in image quality.

For example, the first transistor may include a first gate electrode. The second transistor may include a second gate electrode. Both the first gate electrode and the second gate electrode may overlap with the second electrode.

For example, there may be provided a fifth electrode between the second electrode and the fourth electrode, on a same level as the second electrode and the fourth electrode. The fifth electrode may be electrically connected to neither the first charge accumulation region nor the second charge accumulation region.

Thus, for example, in a case where the fifth electrode functions as a charge discharging electrode, it is possible to limit charge generated in the photoelectric conversion layer coming and going between adjacent pixels, and to discharge unnecessary charge to outside of the photoelectric conversion layer, for example, to a charge discharge region. It is thereby possible to suppress adjacent pixels electrically affecting each other, and it is therefore possible to reduce color mixing in adjacent pixels. Furthermore, the fifth electrode is arranged between the second electrode and the fourth electrode, and can therefore also function as a light-shielding layer. It is therefore possible to reduce the amount of light that leaks into a lower layer from between the second electrode and the fourth electrode.

For example, a distance between the first charge accumulation region and the second charge accumulation region may be 0.1 μm or more.

It is thereby possible to maintain a state in which the first charge accumulation region and the second charge accumulation region are electrically independent.

Hereinafter, embodiments will be described in a specific manner with reference to the drawings.

It should be noted that the embodiments described hereinafter all represent general or specific examples. The numerical values, the shapes, the materials, the constituent elements, the arrangement positions and modes of connection of the constituent elements, the steps, the order of the steps, and the like given in the following embodiments are examples and are not intended to limit the present disclosure. Furthermore, from among the constituent elements in the following embodiments, constituent elements that are not mentioned in the independent claims indicating the most significant concepts are described as optional constituent elements. In the drawings, configurations that are substantially the same are denoted by the same reference numbers, and redundant descriptions have been omitted or simplified.

The various kinds of elements depicted in the drawings are merely depicted in a schematic manner to aid understanding of the present disclosure, and the dimension ratios, the appearance, and the like thereof may be different from the actual elements.

(Embodiment)

Figure 2:
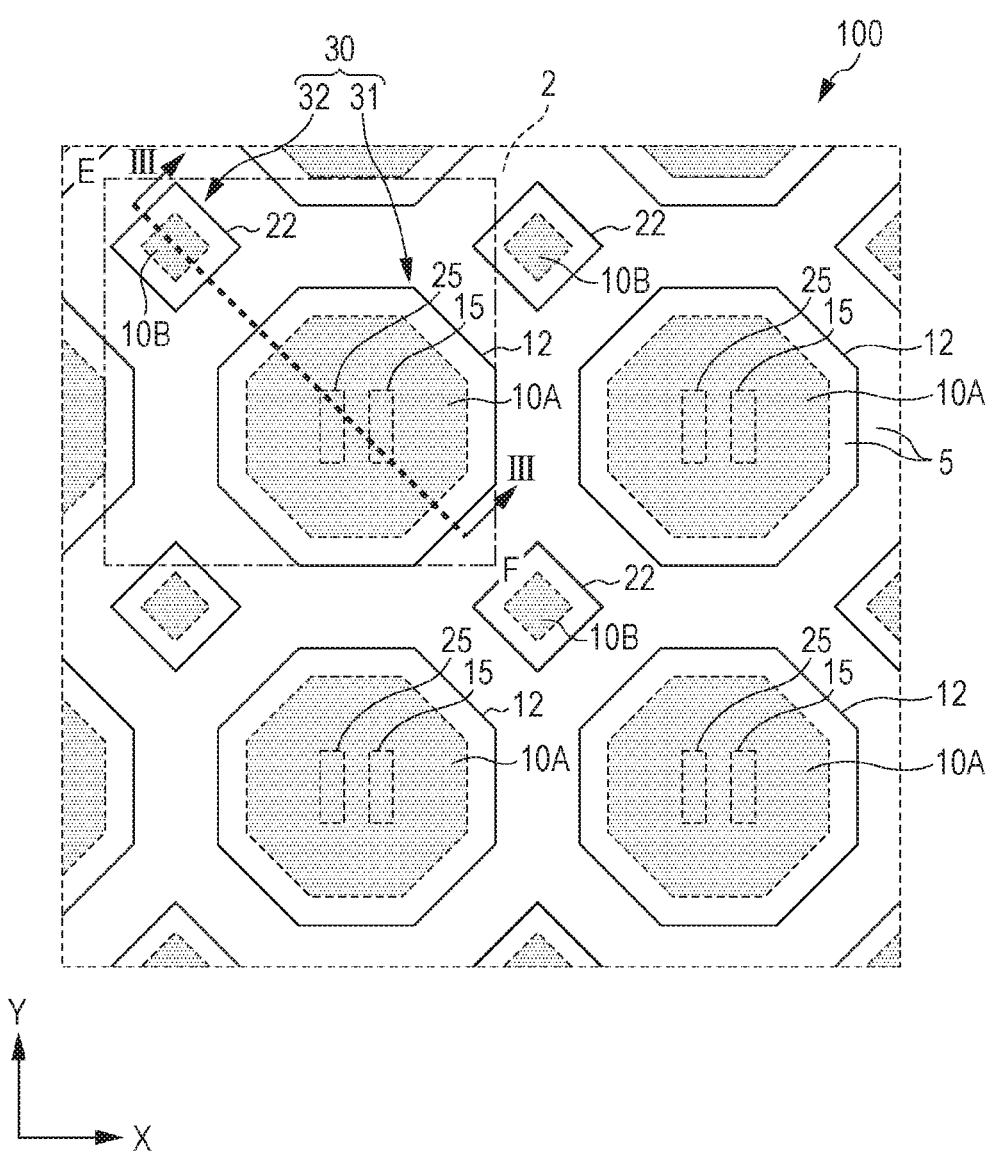
FIG. 2 is a plan view schematically depicting the arrangement of charge accumulation regions in an imaging device according to an embodiment.
Figure 3:
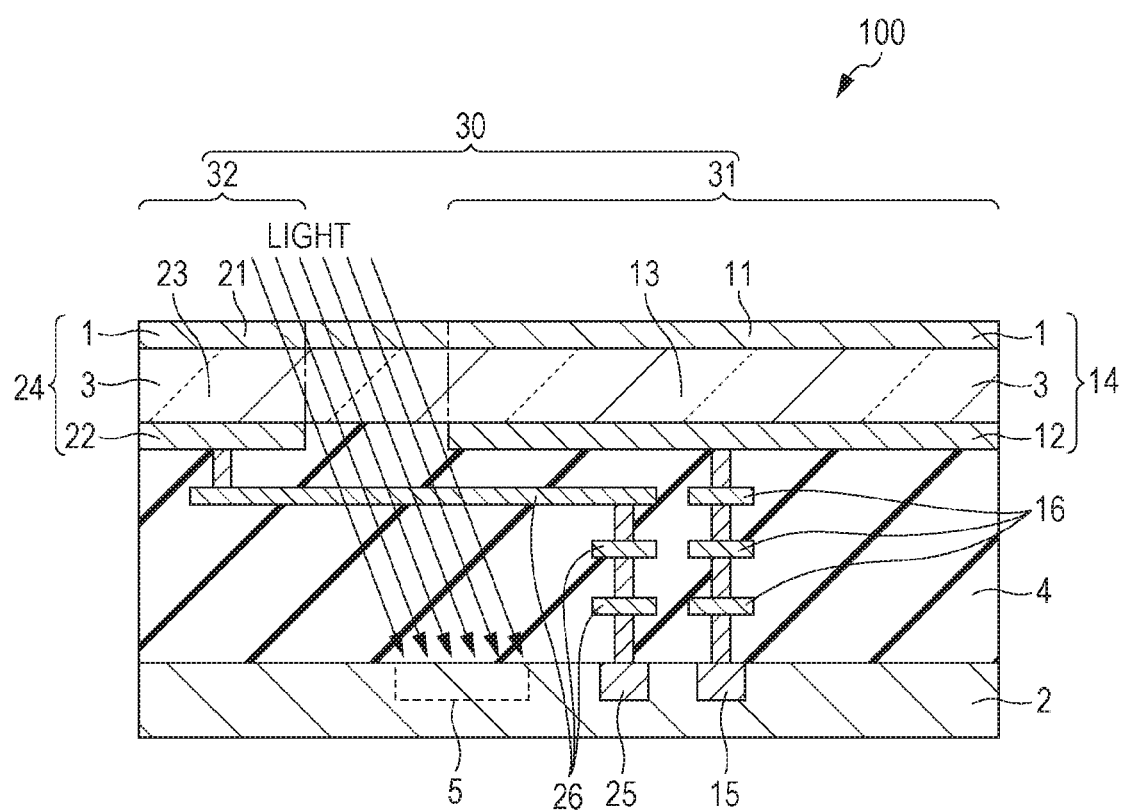
FIG. 3 is a schematic cross-sectional view along line III-III in FIG. 2.

First, the arrangement of charge accumulation regions in an imaging device according to the present embodiment will be described. FIG. 2 is a plan view schematically depicting the arrangement of charge accumulation regions 15 and 25 in an imaging device 100 according to the embodiment. In FIG. 2, a second electrode 12 and a fourth electrode 22, which are pixel electrodes, are depicted using solid lines in order to aid the description. FIG. 3 is a schematic cross-sectional view along line III-III in FIG. 2. In FIG. 3, the boundaries of photoelectric conversion units in the direction in which a first pixel cell 31 and a second pixel cell 32 are arranged side-by-side are depicted by dot-dash lines.

As depicted in FIG. 2, the imaging device 100 is provided with a plurality of pixels 30, and the plurality of pixels 30 each have a first pixel cell 31 and a second pixel cell 32 that is different from the first pixel cell 31.

The first pixel cell 31 is a pixel cell corresponding to low noise, and the second pixel cell 32 is a pixel cell corresponding to high saturation. Typically, the first pixel cell 31 functions as a pixel cell for high sensitivity, and the second pixel cell 32 functions as a pixel cell for low sensitivity.

As depicted in FIG. 3, in the imaging device 100 according to the present embodiment, a unit pixel 30 is configured from the first pixel cell 31 and the second pixel cell 32. It should be noted that, in the present embodiment, a first electrode 11 and a third electrode 21 that are upper electrodes constitute one electrode (hereinafter, referred to as an upper electrode 1), and a first photoelectric conversion layer 13 and a second photoelectric conversion layer 23 that are photoelectric conversion layers constitute one photoelectric conversion layer (hereinafter, referred to as a photoelectric conversion layer 3). The upper electrode 1 may be a transparent electrode such as ITO (indium tin oxide), for example.

The first pixel cell 31 is provided with: a first photoelectric conversion unit 14 that includes the upper electrode 1, the second electrode 12, which opposes the upper electrode 1, and the photoelectric conversion layer 3, which is arranged between the upper electrode 1 and the second electrode 12 and converts incident light into first charge; and a first charge accumulation region 15, which is electrically connected to the second electrode 12 via wiring layers 16.

Furthermore, the second pixel cell 32 is provided with: a second photoelectric conversion unit 24 that includes the upper electrode 1, the fourth electrode 22, which opposes the upper electrode 1, and the photoelectric conversion layer 3, which is arranged between the upper electrode 1 and the fourth electrode 22 and converts incident light into second charge; and a second charge accumulation region 25, which is electrically connected to the fourth electrode 22 via wiring layers 26.

The first charge generated by the photoelectric conversion layer 3 of the first pixel cell 31 is accumulated in the first charge accumulation region 15 via the wiring layers 16 from the second electrode 12. The second charge generated by the photoelectric conversion layer 3 of the second pixel cell 32 is accumulated in the second charge accumulation region 25 via the wiring layers 26 from the fourth electrode 22.

Furthermore, the wiring layers 16 and 26 are covered by an interlayer insulation layer 4.

In an imaging device provided with a photoelectric conversion unit in which a photoelectric conversion layer is arranged between an upper electrode and a lower electrode (also referred to as pixel electrodes) as in the present disclosure, the photoelectric conversion unit and a charge accumulation region are electrically connected via wiring layers, which is different from an imaging device in which a photoelectric conversion unit is provided within a semiconductor substrate.

It should be noted that the wiring layers 16 and 26 are configured from metal wiring such as copper (Cu). In the present embodiment, it is indicated that the wiring layers 16 and 26 have a multilayer wiring structure configured from three layers of Cu wiring; however, the wiring material, the number of wiring layers, and the like may be appropriately selected as necessary.

The area of the second electrode 12 is larger than that of the fourth electrode 22. When viewed from the direction perpendicular to the photoelectric conversion layer 3, in other words, the direction perpendicular to the surface of the semiconductor substrate 102, the first charge accumulation region 15 and the second charge accumulation region 25 are superposed with the second electrode 12. That is, the first charge accumulation region 15 and the second charge accumulation region 25 are formed in a semiconductor substrate 2 in the first pixel cell 31. Thus, the leakage of light into the first charge accumulation region 15 and the second charge accumulation region 25 can be reduced, and deterioration in image quality can be suppressed. It should be noted that these charge accumulation regions are formed by doping the semiconductor substrate 2 with an impurity. The first charge accumulation region 15 and the second charge accumulation region 25 include an impurity of the same conduction type, for example. Furthermore, the first charge accumulation region 15 and the second charge accumulation region 25 may be arranged in such a way as to not be superposed with the fourth electrode 22.

In FIG. 2, the regions other than the shaded regions are regions where incident light hits when incident light that has leaked in from between the second electrode 12 of the first pixel cell 31 and the fourth electrode 22 of the second pixel cell 32 reaches the semiconductor substrate 2, in other words, the light-receiving regions 5 of the semiconductor substrate 2. In plan view, the light-receiving regions 5 are formed in gaps between the second electrodes 12 and the fourth electrodes 22, and in regions within a certain fixed distance from the end sections of these electrodes.

In FIG. 2 once again, the shaded regions 10A and 10B are regions where incident light does not hit even if incident light that has leaked in from between the second electrodes 12 and the fourth electrodes 22 has reached the semiconductor substrate 2. The region 10B of the second pixel cell 32 has an area that is smaller than that of the region 10A of the first pixel cell 31. Therefore, if the second charge accumulation region 25 were arranged in the region 10B, for example, the second charge accumulation region 25 would not fit completely within the region 10B. In this case, light that has leaked in from between the second electrodes 12 and the fourth electrodes 22 would be incident on the second charge accumulation region 25. Thus, photoelectric conversion would occur with respect to the leaked light in the second charge accumulation region 25, which may therefore lead to deterioration in image quality.

Here, the aforementioned phenomenon will be described in a specific manner with reference to FIG. 1 once again. As depicted in FIG. 1, in the imaging device 110 according to the reference example, the first charge accumulation region 115 is arranged in such a way as to be superposed with the central section of the second electrode 112 in plan view. Furthermore, the second charge accumulation region 125 is arranged in such a way as to be superposed with the central section of the fourth electrode 122 in plan view. This drawing depicts the light-receiving regions 5 when incident light has leaked into the furthest regions below the second electrode 112 and the fourth electrode 122, as mentioned above. In this case, the second charge accumulation region 125 of the pixel cell at the low sensitivity side, namely the second pixel cell 132, partially overlaps with a light-receiving region 5 in plan view. Thus, photoelectric conversion occurs with respect to leaked incident light in the second charge accumulation region 125, and therefore there is a possibility of the image quality deteriorating.

However, in the imaging device 100 according to the present embodiment, as depicted in FIG. 2, the first charge accumulation region 15 that is the charge accumulation region for the first pixel cell 31 and the second charge accumulation region 25 that is the charge accumulation region for the second pixel cell 32 are both arranged within the region 10A of the semiconductor substrate 2 for the first pixel cell 31. In this case, as depicted in FIGS. 2 and 3, the first charge accumulation region 15 and the second charge accumulation region 25 are not superposed with a light-receiving region 5 in plan view. Thus, the leakage of light into the first charge accumulation region 15 and the second charge accumulation region 25 can be reduced, and deterioration in image quality can be suppressed.

An example of the first pixel cell 31 and the second pixel cell 32 will be given and described with reference to FIGS. 2 and 3 once again.

The first pixel cell 31 is configured as a pixel cell having high sensitivity. Furthermore, the second pixel cell 32 is configured as a pixel cell having low sensitivity. The sizes of the areas of the second electrode 12 belonging to the first pixel cell 31 and the fourth electrode 22 of the second pixel cell 32 are decided according to a sensitivity ratio setting. As an example, if the unit pixel 30 has a region that is 2 μm×2 μm in both the x direction and the y direction in plan view (the region enclosed by the dot-dash line in FIG. 2), a certain vertex of the region is taken as E, and the vertex opposing the vertex E is taken as F, the length of a line segment EF becomes $2\sqrt{2}\approx 2.8$ μm. In this case, if the sensitivity difference due to the area difference between the second electrode 12 and the fourth electrode 22 is taken as being 10-fold, the fourth electrode 22 has a length that is $1/(\sqrt{10})\approx 0.32$ times that of the second electrode 12 in terms of the length along the EF line segment. If the length of the gap between the second electrode 12 and the fourth electrode 22 is taken as 0.4 μm, the length of the fourth electrode 22 in the horizontal direction in FIG. 3 is approximately 0.5 μm, and the length of the second electrode 12 is approximately 1.5 μm.

Here, each of the first charge accumulation region 15 and the second charge accumulation region 25 are regions of the order of 0.3 μm×0.1 μm, for example, when viewed from the direction perpendicular to the photoelectric conversion layer 3. Although the transistor configuration is not depicted in FIGS. 2 and 3, a size of this order is necessary for these charge accumulation regions to function as a transistor drain region described later on. Therefore, the sizes of the charge accumulation regions are not especially small even when compared to the size of the fourth electrode 22 (here, the length of one side being approximately 0.5 μm) indicated in the aforementioned example. Consequently, as depicted in FIG. 2, even if these charge accumulation regions were arranged in such a way as to be superposed with the fourth electrode 22 in plan view and to be positioned in the central section of the region 10B of the semiconductor substrate 2 where leaked light does not hit, these charge accumulation regions would not fit completely within the region 10B. Therefore, even if these charge accumulation regions were arranged in the region 10B, leaked light would be incident on the charge accumulation regions. However, if the sizes of the charge accumulation regions are compared to the size of the second electrode 12 (the length of one side being approximately 1.5 μm), the charge accumulation regions are sufficiently small. If these charge accumulation regions are arranged in such a way as to be superposed with the second electrode in plan view and to be positioned in the central section of the region 10A of the semiconductor substrate 2, the entry of leaked light can be reduced.

It should be noted that the aforementioned numerical values are examples and may change according to the sensitivity difference between the first pixel cell 31 and the second pixel cell 32 and the size of the unit pixel 30 that are set. The second electrode 12 and the fourth electrode 22 can be made larger if the size of the unit pixel 30 is made larger.

Furthermore, the area of the fourth electrode 22 which is smaller than that of the second electrode 12 can be made larger if the area difference between the second electrode and the fourth electrode is made smaller.

In order to reduce the effect of leaked light from between the second electrode 12 and the fourth electrode 22, it is necessary to arrange the first charge accumulation region 15 and the second charge accumulation region 25 in a region where it is difficult for leaked light to reach. In this case, it is most desirable that these charge accumulation regions be arranged in such a way as to be superposed in plan view with the second electrode 12 having a larger area than the fourth electrode 22 and to be positioned near the central section of the region 10A of the semiconductor substrate 2.

In the imaging device 100 according to the present embodiment, the first charge accumulation region 15 and the second charge accumulation region 25 are both superposed in plan view with the second electrode 12 and are arranged in the region 10A of the semiconductor substrate 2. A reduction in parasitic light reception sensitivity is thereby realized. It should be noted that the aforementioned effect can be obtained as long as the first charge accumulation region 15 and the second charge accumulation region 25 are arranged in such a way as to be superposed with the second electrode 12 in plan view. For example, the first charge accumulation region 15 and the second charge accumulation region 25 do not necessarily have to be arranged in such a way as to be superposed with the region 10A of the semiconductor substrate 2. Furthermore, all of the first charge accumulation region 15 and all of the second charge accumulation region 25 may be arranged in such a way as to be superposed with the second electrode 12 in plan view. It should be noted that the first charge accumulation region 15 and the second charge accumulation region 25 may be separated by 0.1 μm or more in order to maintain an electrical separation in the semiconductor substrate 2 between the first charge accumulation region 15 and the second charge accumulation region 25.

Regarding the arrangement of the wiring layers 26 in the second pixel cell 32, by extending the wiring layers 26 from the fourth electrode 22 toward the second electrode 12, the fourth electrode 22 and the second charge accumulation region 25 are electrically connected. It should be noted that a third layer nearest the fourth electrode 22 from within the wiring layers 26 in the drawings extends toward the second electrode 12. However, the other layers of the wiring layers 26, for example, the second layer or the like, may be extended, or a plurality of layers of the wiring layers 26, for example, the first and the third layer, may be combined and extended.

Figure 4:
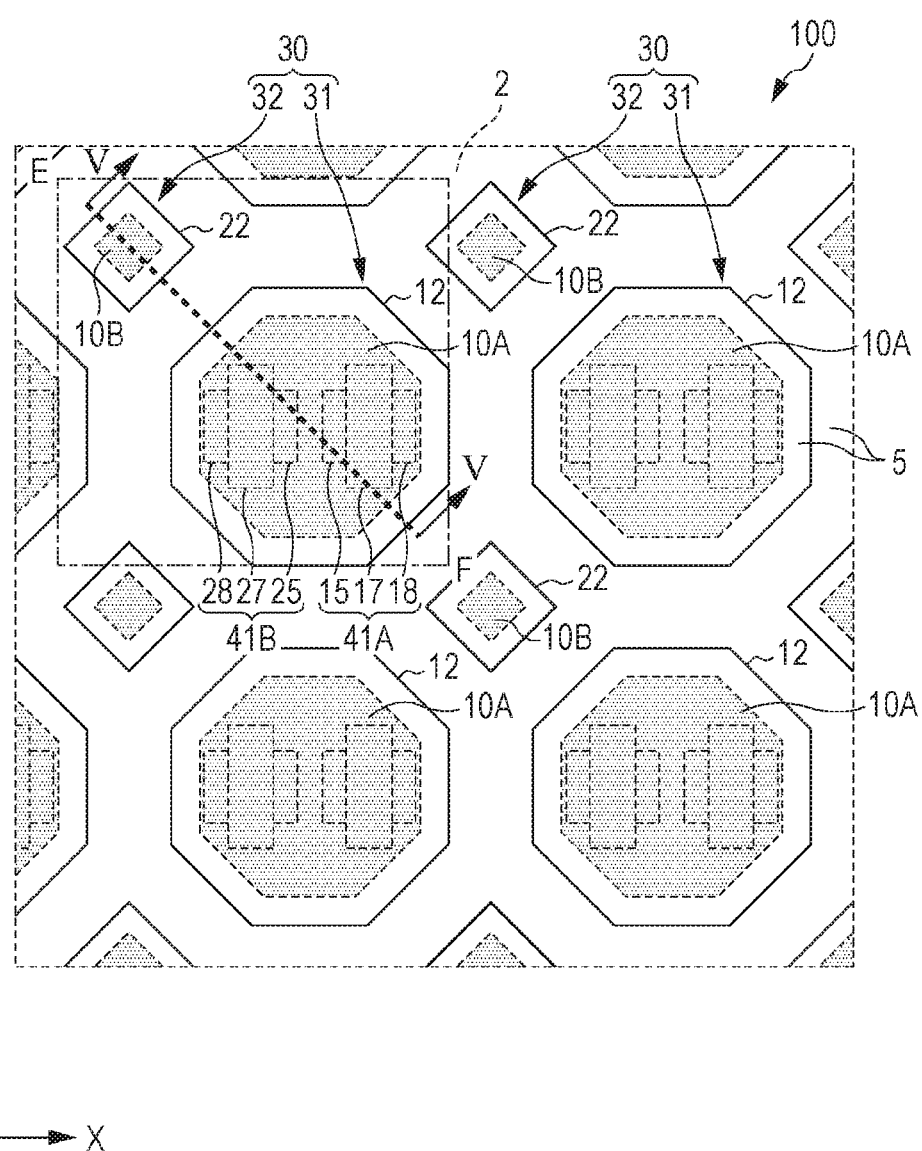
FIG. 4 is a plan view schematically depicting the imaging device according to the embodiment.

Next, the configuration of the imaging device 100 will be described using a plan view of the imaging device 100 according to the present embodiment. FIG. 4 is a plan view schematically depicting the imaging device 100 according to the present embodiment.

As depicted in FIG. 4, in the imaging device 100, the first pixel cell 31 is provided with a first transistor 41A that has the first charge accumulation region 15 as one of a source and a drain. The first transistor 41A is configured from the first charge accumulation region 15, a first gate 17, and a first diffusion region 18. Furthermore, the second pixel cell 32 is provided with a second transistor 41B that has the second charge accumulation region 25 as one of a source and a drain. The second transistor 41B is configured from the second charge accumulation region 25, a second gate 27, and a second diffusion region 28.

Furthermore, when viewed from the direction perpendicular to the photoelectric conversion layer 3, the first diffusion region 18, which is the other of the source and the drain of the first transistor 41A, and the second diffusion region 28, which is the other of the source and the drain of the second transistor 41B, may be superposed with the second electrode 12. Furthermore, when viewed from the direction perpendicular to the photoelectric conversion layer 3, the first diffusion region 18 and the second diffusion region 28 may be arranged in such a way as to not be superposed with the fourth electrode 22. It should be noted that, in the present embodiment, the first transistor 41A of the first pixel cell 31 and the second transistor 41B of the second pixel cell 32 are arranged within the region 10A of the semiconductor substrate 2.

Figure 5:
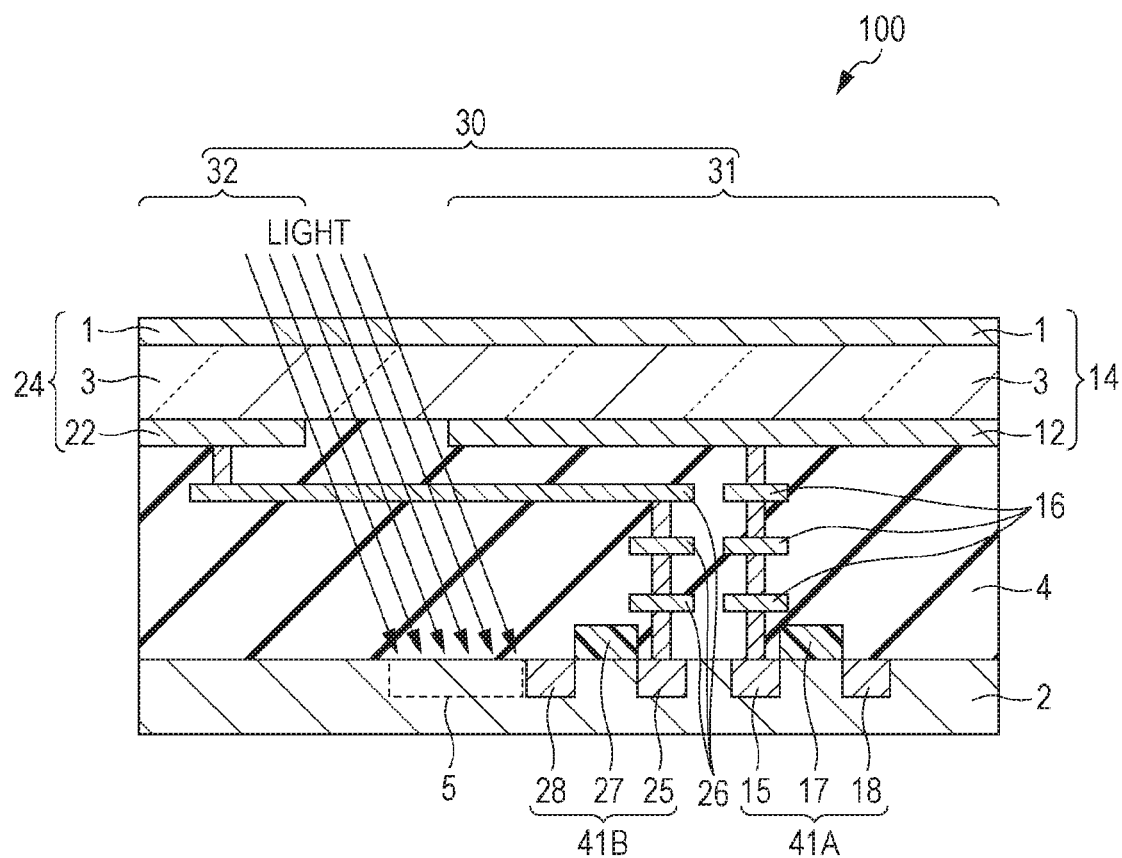
FIG. 5 is a schematic cross-sectional view along line V-V in FIG. 4.

FIG. 5 is a schematic cross-sectional view along line V-V in FIG. 4. The same constituent elements as in FIG. 4 are denoted by the same reference numbers in FIG. 5, and a description thereof is omitted. Here, the configuration of the first transistor 41A and the second transistor 41B will be described.

As depicted in FIG. 5, in the imaging device 100 according to the present embodiment, the first gate 17 is arranged in such a way as to be in contact with the first charge accumulation region 15. The first gate 17 is formed of polysilicon, for example. Polysilicon is a material used in general CMOS manufacturing processes. There is therefore a benefit in that there is little need to add equipment or steps if the first gate 17 is formed of polysilicon. Furthermore, the first diffusion region 18 is arranged at the opposite side to the first charge accumulation region 15 with the first gate 17 interposed therebetween. The first diffusion region 18 is formed by doping the semiconductor substrate 2 with an impurity. The first diffusion region 18 includes an impurity of the same conduction type as the first charge accumulation region 15.

The first charge accumulation region 15, the first gate 17, and the first diffusion region 18 constitute an MOS (metal oxide semiconductor) transistor (hereinafter, referred to as the first transistor 41A). Due to a bias voltage that is applied to the first gate 17, the first transistor 41A enters an on state, and the first charge accumulation region 15 and the first diffusion region 18 are electrically connected. The polysilicon forming the first gate 17 transmits light, and therefore, if leaked light hits the first gate 17, the leaked light passes through the first gate 17 and is incident on the channel of the semiconductor substrate 2. Photoelectric conversion thereby occurs in the channel of the first transistor 41A. If the charge generated by the photoelectric conversion reaches the first charge accumulation region 15, as a false signal the charge becomes a cause for image quality deterioration. Likewise, if leaked light is incident on the first diffusion region 18 when the first transistor 41A is in an on state, because the first diffusion region 18 is electrically connected to the first charge accumulation region 15, there is a possibility of a false signal reaching the first charge accumulation region 15 and image quality deteriorating. That is, leaked light being incident on the first gate 17 and the first diffusion region 18 is also a cause for the parasitic light reception sensitivity becoming worse depending on the operating state of the first transistor 41A. Consequently, a countermeasure for reducing the incidence of leaked light such as the aforementioned is required.

Likewise, the second gate 27 and the second diffusion region 28 are arranged in such a way as to be in contact with the second charge accumulation region 25. The second charge accumulation region 25, the second gate 27, and the second diffusion region 28 constitute an MOS transistor (hereinafter, referred to as the second transistor 41B). For a reason similar to the reason mentioned above with regard to the first transistor 41A, a countermeasure for reducing the incidence of leaked light on not only the second charge accumulation region 25 but also the second gate 27 and the second diffusion region 28 is also necessary in the second transistor 41B.

Based on the above, in the present embodiment, it is desirable for the first transistor 41A to be arranged in such a way that the first gate 17 and the first diffusion region 18 as well as the first charge accumulation region 15 are superposed with the second electrode 12 when viewed from the direction perpendicular to the photoelectric conversion layer 3. Furthermore, in the present embodiment, it is desirable for the second transistor 41B to be arranged in such a way that the second gate 27 and the second diffusion region 28 as well as the second charge accumulation region 25 are superposed with the second electrode 12 when viewed from the direction perpendicular to the photoelectric conversion layer 3. Furthermore, the first transistor 41A and the second transistor 41B may be arranged in such a way as to not be superposed with the fourth electrode 22 when viewed from the direction perpendicular to the photoelectric conversion layer 3. For example, as depicted in FIGS. 4 and 5, it is desirable for the first transistor 41A and the second transistor 41B to both be arranged in the region 10A of the semiconductor substrate 2 for the first pixel cell 31, and to be arranged in such a way as to not be superposed in plan view with the light-receiving region 5. Thus, the incidence of leaked light on the first transistor 41A and the second transistor 41B can be reduced, and parasitic light reception sensitivity and false signals can be reduced.

An example of the arrangement of the first transistor 41A and the second transistor 41B will be given and described with reference to FIG. 4 once again. As in the example mentioned above with reference to FIGS. 2 and 3, the unit pixel 30 has a region that is 2 μm×2 μm in both the x direction and the y direction in plan view (the region enclosed by the dot-dash line in FIG. 4), and the distance of the gap between the second electrode 12 and the fourth electrode 22 is taken as 0.4 μm. Furthermore, the length of the fourth electrode 22 in the horizontal direction in FIG. 3 is taken as approximately 0.5 μm, and the length of the second electrode 12 is taken as approximately 1.5 μm. Furthermore, if each of the first charge accumulation region 15 and the second charge accumulation region 25 are taken as regions of the order of 0.3 μm×0.1 μm when viewed from the direction perpendicular to the photoelectric conversion layer 3, the first diffusion region 18 and the second diffusion region 28 have approximately equivalent sizes as the first charge accumulation region 15 and the second charge accumulation region 25. Furthermore, the first gate 17 and the second gate 27 are formed slightly larger than the charge accumulation regions thereof, and are therefore taken as 0.5 μm×0.3 μm, for example.

Here, a case where the second transistor 41B is arranged in the semiconductor substrate 2 for the second pixel cell 32 will be described. When viewed from the direction perpendicular to the photoelectric conversion layer 3, if the second charge accumulation region 25 (of the order of 0.3 μm×0.1 μm) were arranged in such a way as to fit in the region (the length of one side being approximately 0.5 μm) of the semiconductor substrate 2 that is superposed with the fourth electrode 22, the second gate 27 and the second diffusion region 28 would not fit completely within this region. Therefore, it would become easy for light that has leaked in from between the second electrode 12 and the fourth electrode 22 to be incident on the second gate 27 and the second diffusion region 28. There would therefore be a possibility of a false signal reaching the second charge accumulation region 25 and image quality deteriorating, depending on the operating state of the second transistor.

Figure 6:
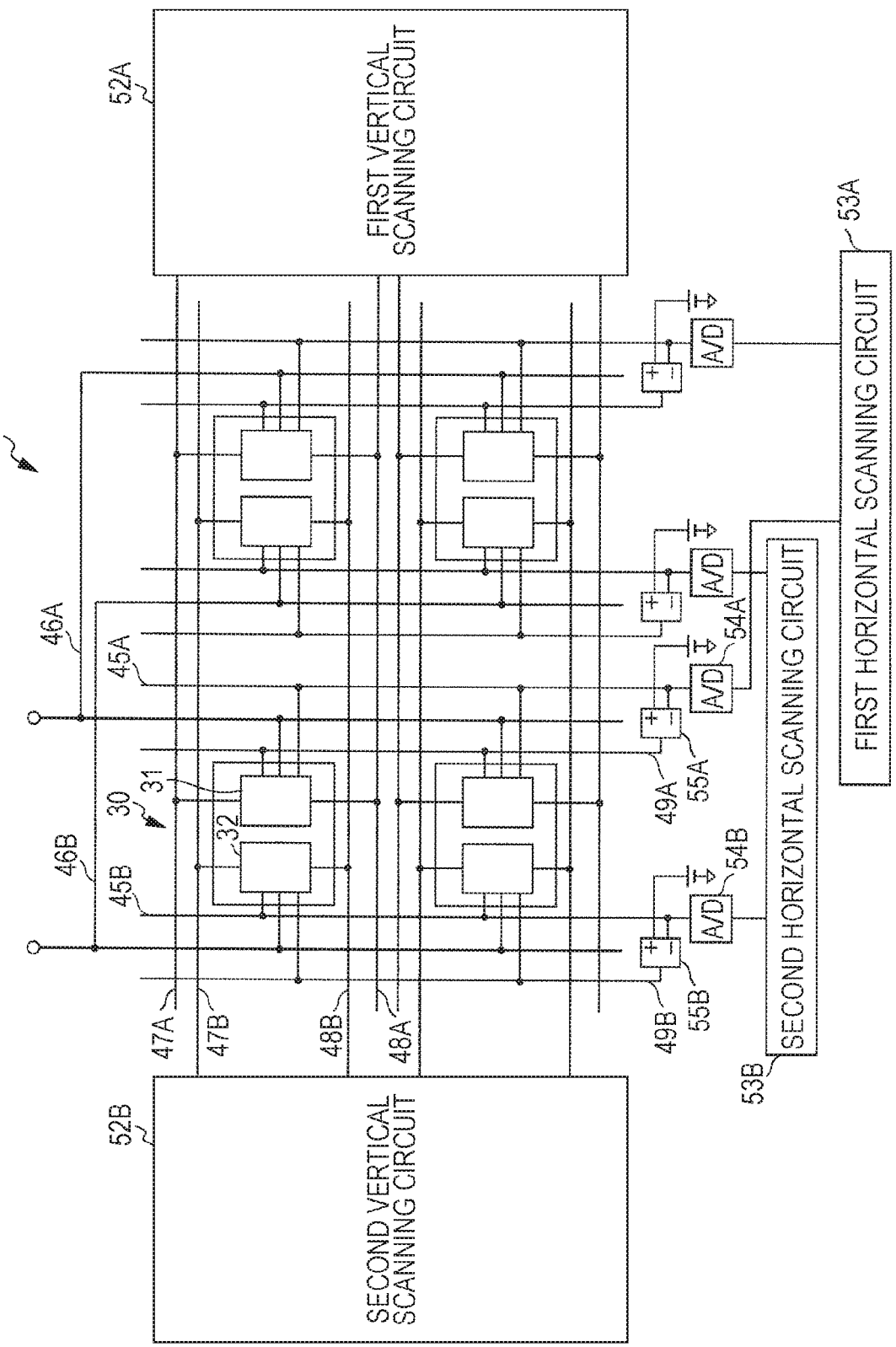
FIG. 6 is a drawing depicting the circuit configuration of the imaging device according to the embodiment.

The structure of the imaging device according to the embodiment will be described with reference to FIG. 6. FIG. 6 is a drawing depicting the circuit configuration of the imaging device 100 according to the embodiment.

As depicted in FIG. 6, the imaging device 100 according to the present embodiment is provided with a plurality of unit pixels 30 arrayed in a two-dimensional manner. It should be noted that, in practice, several million unit pixels 30 are arrayed in a two-dimensional manner. From thereamong, FIG. 6 depicts unit pixels 30 arranged in a 2×2 matrix form. Furthermore, the imaging device 100 may be a line sensor. In such a case, the plurality of unit pixels 30 would be arranged in a one-dimensional manner, for example, in the form of a line in the row direction or the column direction.

The unit pixels 30 have a first pixel cell 31 and a second pixel cell 32. As mentioned above, the first pixel cell 31 functions as an imaging cell for high sensitivity, and the second pixel cell 32 functions as an imaging cell for low sensitivity.

The imaging device 100 is provided with a plurality of reset signal lines 47A and a plurality of address signal lines 48A arranged for each row, and a plurality of vertical signal lines 45A, power source wiring 46A, and a plurality of feedback signal lines 49A arranged for each column. The reset signal lines 47A, the address signal lines 48A, the vertical signal lines 45A, the power source wiring 46A, and the feedback signal lines 49A are connected to the first pixel cells 31.

Furthermore, the imaging device 100 is provided with a plurality of reset signal lines 47B and a plurality of address signal lines 48B arranged for each row, and a plurality of vertical signal lines 45B, power source wiring 46B, and a plurality of feedback signal lines 49B arranged for each column. The reset signal lines 47B, the address signal lines 48B, the vertical signal lines 45B, the power source wiring 46B, and the feedback signal lines 49B are connected to the second pixel cells 32.

The imaging device 100 is separately provided with a first peripheral circuit that processes signals from the first pixel cells 31, and a second peripheral circuit that processes signals from the second pixel cells 32. The first peripheral circuit has a first vertical scanning circuit 52A, a first horizontal scanning circuit 53A, and a first column AD conversion circuit 54A, and the second peripheral circuit has a second vertical scanning circuit 52B, a second horizontal scanning circuit 53, and a second column AD conversion circuit 54B. However, it is possible for the address signal lines 48A and 48B of the first pixel cells 31 and the second pixel cells 32 to be made common depending on the configuration of the pixels.

Here, focusing on the second pixel cells 32, the second vertical scanning circuit 52B controls the plurality of reset signal lines 47B and the plurality of address signal lines 48B. The vertical signal lines 45B are connected to the second horizontal scanning circuit 53, and pixel signals are transmitted to the second horizontal scanning circuit 53B. The power source wiring 46B supplies a power source voltage to the second pixel cells 32 of all of the unit pixels 30. The feedback signal lines 49B transmit feedback signals from a reset voltage generating circuit 55B, which generates a reset voltage on the basis of a voltage of the vertical signal lines 45B and a reference voltage, to the second pixel cells 32 of the unit pixels 30. In the first pixel cells 31 also, various types of signal lines are arranged in a manner similar to the second pixel cells 32, and the signal lines are controlled by the respective circuits.

Figure 7:
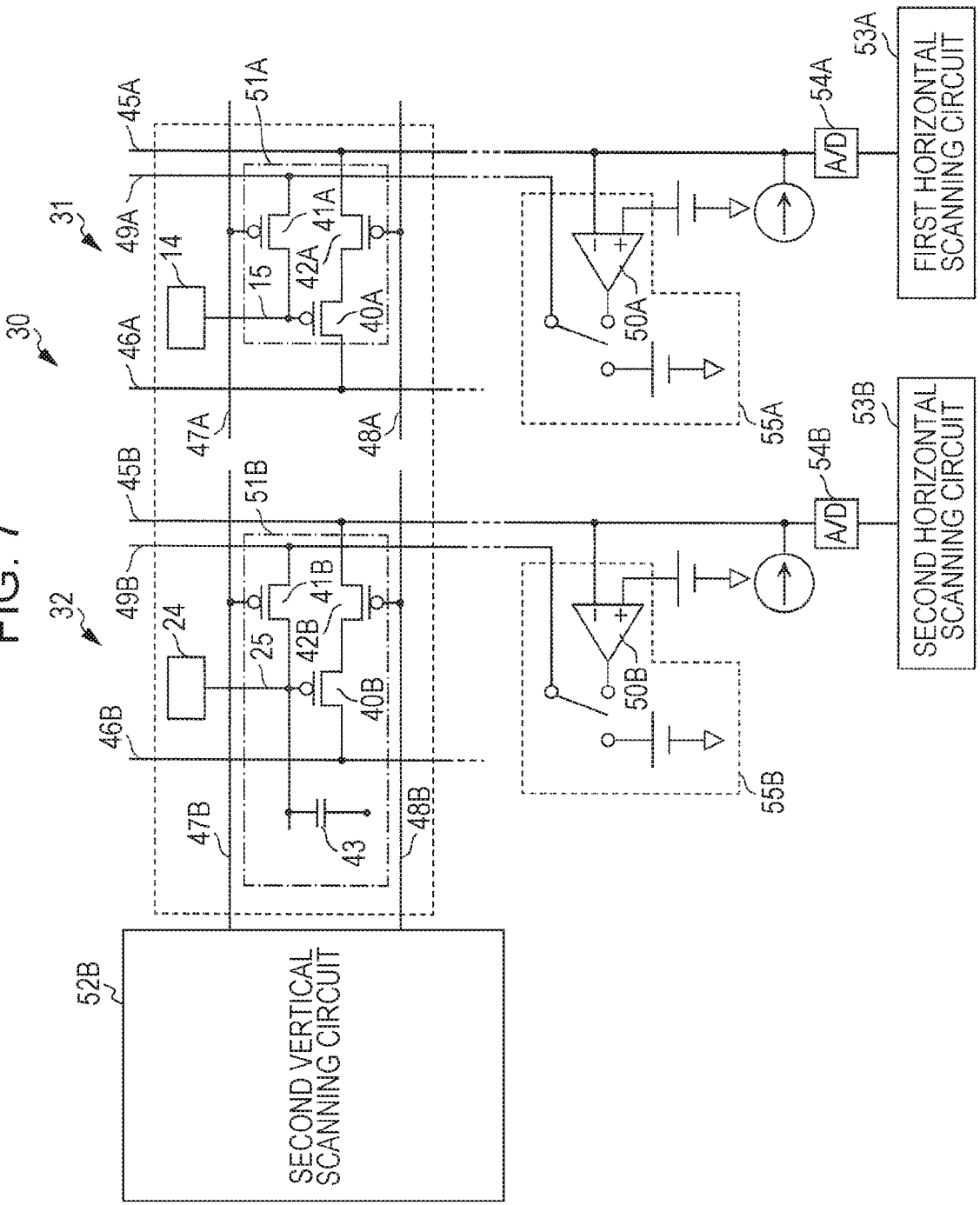
FIG. 7 is a drawing depicting the circuit configuration of a unit pixel in the embodiment.

Next, an example of the circuit configuration of the first pixel cell 31 and the second pixel cell 32 will be described with reference to FIG. 7. FIG. 7 is a drawing depicting the circuit configuration of the unit pixel 30 in the embodiment. It should be noted that the first pixel cell 31 and the second pixel cell 32 have independent circuit configurations that are substantially the same.

The second pixel cell 32 includes the second photoelectric conversion unit 24 and a second charge detection circuit 51B, and the first pixel cell 31 includes the first photoelectric conversion unit 14 and a first charge detection circuit 51A. Hereinafter, the circuit configuration will be described focusing on the second pixel cell 32.

The second charge detection circuit 51B includes an amplification transistor 40B, a reset transistor 41B, an address transistor 42B, and a capacitance element 43. The capacitance element 43 is an MOM capacitor, for example. Likewise, the first charge detection circuit 51A of the first pixel cell 31 includes an amplification transistor 40A, a reset transistor 41A, and an address transistor 42A.

The second photoelectric conversion unit 24 is electrically connected to a drain electrode of the reset transistor 41B and a gate electrode of the amplification transistor 40B, and performs photoelectric conversion on light that is incident on the second pixel cell 32 (incident light). The second photoelectric conversion unit 24 generates signal charge corresponding to the amount of incident light. The generated signal charge is accumulated by the second charge accumulation region 25. Likewise, the first photoelectric conversion unit 14 of the first pixel cell 31 is electrically connected to a drain electrode of the reset transistor 41A and a gate electrode of the amplification transistor 40A, and signal charge generated according to the amount of incident light is accumulated by the first charge accumulation region 15.

The power source wiring 46B is connected to a source electrode of the amplification transistor 40B. The power source wiring 46B is arranged in the column direction, which is due to the following reason. The second pixel cells 32 are selected in row units. Therefore, if the power source wiring 46B is arranged in the row direction, the pixel drive current for one row passes to the entirety of one line of the power source wiring 46B and the voltage drop increases. A common source follower power source voltage is applied to the amplification transistor 40B within all of the second pixel cells 32 in the imaging device 100 by means of the power source wiring 46B. Likewise, the power source wiring 46A is connected to a source electrode of the amplification transistor 40A, and a common source follower power source voltage is applied to the amplification transistor 40A within all of the first pixel cells 31 in the imaging device 100 by means of the power source wiring 46A.

The amplification transistors 40A and 40B amplify signal voltages that correspond to the amounts of signal charge accumulated in the first charge accumulation region 15 and the second charge accumulation region 25 respectively.

A gate electrode of the reset transistor 41B is connected to the second vertical scanning circuit 52B via a reset signal line 47B, and a source electrode is connected to a feedback signal line 49B. The reset transistor 41B resets (initializes) charge accumulated in the second charge accumulation region 25. To paraphrase, the reset transistor 41B resets the potential of the gate electrode of the amplification transistor 40B. Likewise, a gate electrode of the reset transistor 41A is connected to the first vertical scanning circuit 52A via a reset signal line 47A, and a source electrode is connected to a feedback signal line 49A and resets charge accumulated in the first charge accumulation region 15.

A gate electrode of the address transistor 42B is connected to the second vertical scanning circuit 52B via an address signal line 48B, and a drain electrode is connected to the second horizontal scanning circuit 53B via a vertical signal line 45B. The address transistor 42B selectively outputs an output voltage of the amplification transistor 40B to a vertical signal line 45B. Likewise, a gate electrode of the address transistor 42A is connected to the first vertical scanning circuit 52A via an address signal line 48A, a drain electrode is connected to the first horizontal scanning circuit 53A via a vertical signal line 45A, and an output voltage of the amplification transistor 40A is selectively output to a vertical signal line 45A.

The first vertical scanning circuit 52A applies a row selection signal that controls the address transistor 42A to be on or off, to the gate electrode of the address transistor 42A. The second vertical scanning circuit 52B applies a row selection signal that controls the address transistor 42B to be on or off, to the gate electrode of the address transistor 42B. Thus, a row to be read is selected with rows to be read being scanned in the vertical direction (column direction). Signal voltages are read out to the vertical signal lines 45A and 45B from the unit pixels 30 of the selected row. Furthermore, the first vertical scanning circuit 52A applies a reset signal that controls the reset transistor 41A to be on or off, to the gate electrode of the reset transistor 41A. Furthermore, the second vertical scanning circuit 52B applies a reset signal that controls the reset transistor 41B to be on or off, to the gate electrode of the reset transistor 41B. A row of first pixel cells 31 and second pixel cells 32 of unit pixels 30 targeted for a reset operation is thereby selected.

A reset voltage generating circuit 55A switches between generating a reset voltage using a signal that has been output to a vertical signal line 45A, and generating a reset voltage using a fixed voltage. The reset voltage generating circuit 55B switches between generating a reset voltage using a signal that has been output to a vertical signal line 45B, and generating a reset voltage using a fixed voltage. It should be noted that a feedback amplifier 50A of the reset voltage generating circuit 55A is an amplifier that amplifies and outputs the difference between the voltage of a vertical signal line 45A and the reference voltage, and a feedback amplifier 50B of the reset voltage generating circuit 55B is an amplifier that amplifies and outputs the difference between the voltage of a vertical signal line 45B and the reference voltage.

The first column AD conversion circuit 54A performs noise-suppression signal processing represented by correlated double sampling, for example, and analog-digital conversion (also referred to as AD conversion) on signals that have been read out from the first pixel cells 31 to the vertical signal lines 45A in each row. The second column AD conversion circuit 54B performs noise-suppression signal processing represented by correlated double sampling, for example, and analog-digital conversion (also referred to as AD conversion) on signals that have been read out from the second pixel cells 32 to the vertical signal lines 45B in each row. The first horizontal scanning circuit 53A and the second horizontal scanning circuit 53B respectively drive the reading of signals processed by the first column AD conversion circuit 54A and the second column AD conversion circuit 54B.

From the above, in the imaging device 100 according to the present embodiment, parasitic light reception sensitivity can be reduced without adding new elements. Therefore, it becomes possible to improve the performance of an imaging device while suppressing a rise in production costs.

(Modified Examples)

Figure 8:
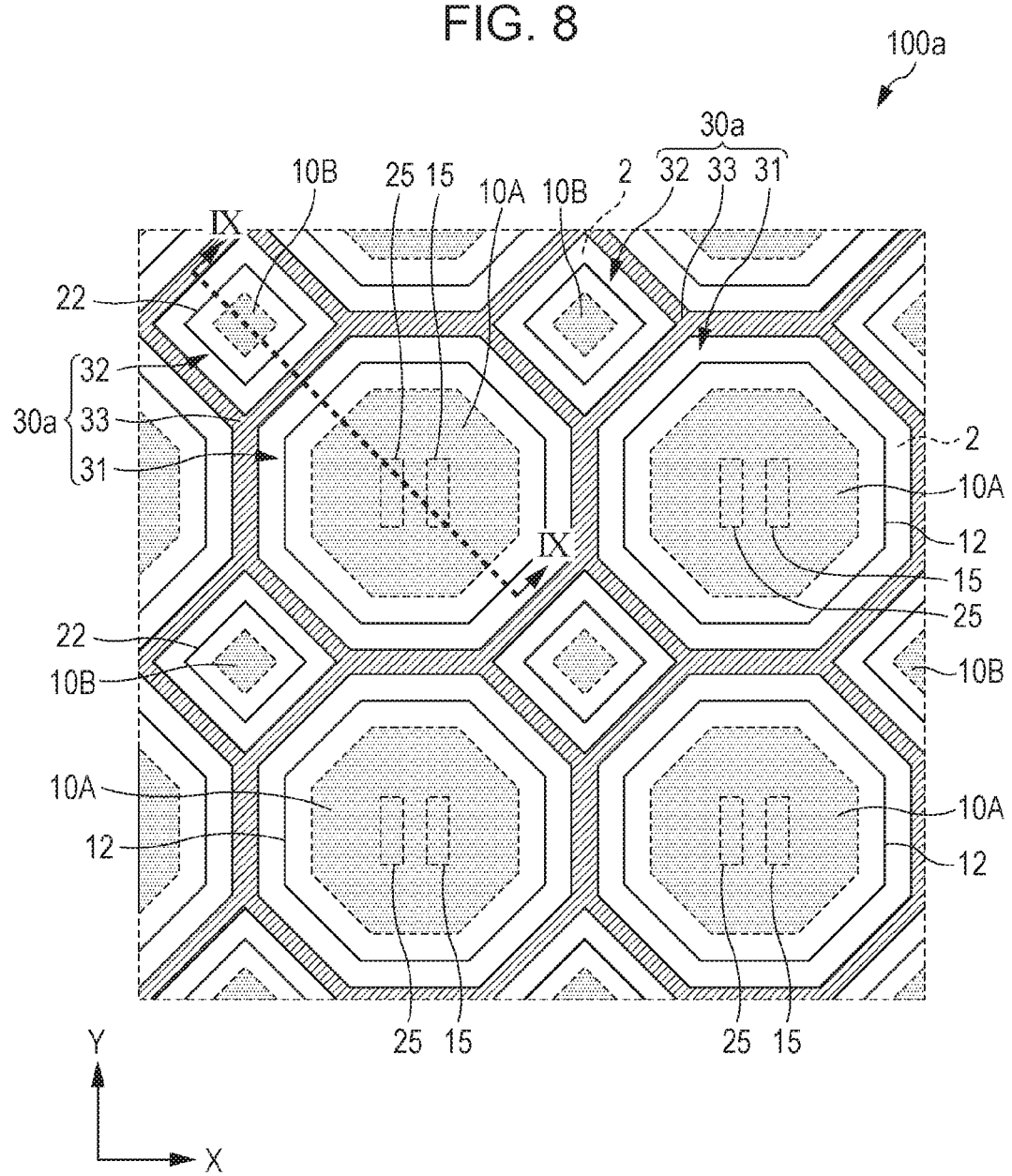
FIG. 8 is a plan view schematically depicting the arrangement of charge accumulation regions in an imaging device according to a modified example of the embodiment.
Figure 9:
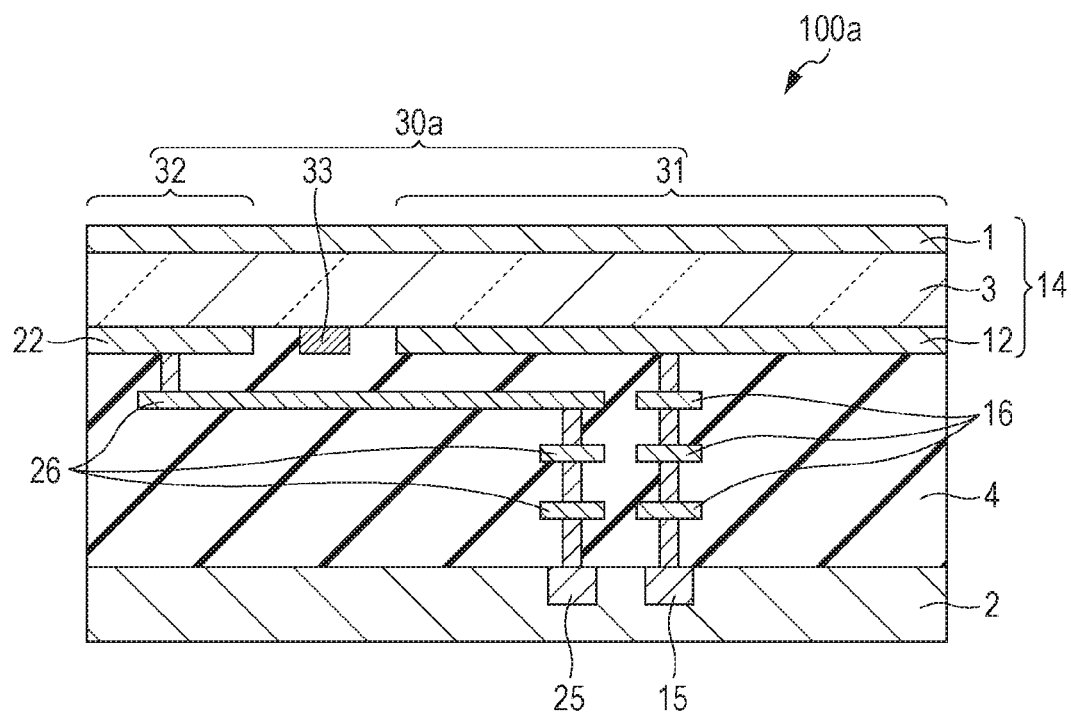
FIG. 9 is a schematic cross-sectional view along line IX-IX in FIG. 8.

Hereinafter, the configuration of an imaging device 100a according to a modified example of the embodiment will be described with reference to FIGS. 8 and 9. FIG. 8 is a plan view schematically depicting the arrangement of charge accumulation regions in the imaging device 100a according to the modified example of the embodiment. FIG. 9 is a schematic cross-sectional view along line IX-IX in FIG. 8.

In the present modified example, only the differences with the imaging device 100 according to the embodiment will be described. As depicted in FIGS. 8 and 9, the imaging device 100a according to the present modified example has a fifth electrode 33 positioned in the same layer (i.e., on the same level) as the second electrode 12 and the fourth electrode 22. The fifth electrode 33 is not electrically connected to the first charge accumulation region 15 and the second charge accumulation region 25.

The fifth electrode 33 may be used as a charge discharging electrode. In such a case, it is possible to limit charge generated by the photoelectric conversion layer 3 coming and going between two adjacent pixel cells 31 and 32 and between a plurality of adjacent unit pixels 30a, and unnecessary charge can be discharged to outside of the photoelectric conversion layer 3. Color mixing in adjacent pixels can thereby be suppressed. Furthermore, the fifth electrode 33 is arranged between the second electrode 12 and the fourth electrode 22, which are lower electrodes, and therefore also functions as a light-shielding layer. The fifth electrode 33 is made to function as a light-shielding layer, and therefore may be configured from an electrically conductive resin or the like that includes a metal or a black resist material. In this way, due to the fifth electrode 33 functioning as a light-shielding layer, it is possible to reduce the amount of light that leaks into the semiconductor substrate 2 from between the second electrode 12 and the fourth electrode 22. Thus, compared to the imaging device 100 which does not have the fifth electrode 33, the leaking of light into the first charge accumulation region 15 and the second charge accumulation region 25 can be further reduced, and deterioration in image quality can be suppressed.

An example of the arrangement of the fifth electrode 33, the second electrode 12, and the fourth electrode 22 will be given and described with reference to FIG. 8 once again. The fifth electrode 33 is arranged in the same layer (i.e., on the same level) as the second electrode 12 and the fourth electrode 22. Here, as in the example mentioned above in the embodiment, the unit pixel 30a has a region that is 2 μm×2 μm in both the x direction and the y direction in plan view (not depicted in FIG. 8 from the standpoint of ease of viewing), and the length of the gap between the second electrode 12 and the fourth electrode 22 is taken as 0.4 μm. In this case, from the standpoint of maintaining an electrical separation between electrodes, the length of the fifth electrode 33 in the direction of line IX-IX can be 0.1 μm, for example. In this case, the distances between the fifth electrode 33 and the second electrode 12 and fourth electrode 22 are both 0.15 μm.

Furthermore, in order to reduce the effect of leaked light from between the second electrode 12 and the fourth electrode 22, it is necessary to arrange the first charge accumulation region 15 and the second charge accumulation region 25 in a region where it is difficult for leaked light to reach. In this case, it is most desirable that these charge accumulation regions be arranged in such a way as to be superposed in plan view with the second electrode 12 having a larger area than the fourth electrode 22 and to be positioned near the central section of the region 10A of the semiconductor substrate 2.

Hereinabove, the imaging device according to the present disclosure has been described based on an embodiment and a modified example; however, the present disclosure is not restricted to the embodiment and the modified example. Modes in which various modifications conceived by a person skilled in the art have been implemented in the embodiment and the modified example, and other modes constructed by combining some the constituent elements in the embodiment and the modified example are also included within the scope of the present disclosure provided they do not depart from the gist of the present disclosure.

It should be noted that, in the imaging devices 100 and 100a according to the embodiment and the modified example, the first pixel cell 31 and the second pixel cell 32 are provided with the upper electrode 1 and the photoelectric conversion layer 3 which are common thereto. However, the first pixel cell 31 and the second pixel cell 32 may be provided with the first electrode 11 and the third electrode 21 being independent upper electrodes, and the first photoelectric conversion layer 13 and the second photoelectric conversion layer 23 being independent photoelectric conversion layers. In this case, an insulation layer may be provided between the first photoelectric conversion unit 14 of the first pixel cell 31 and the second photoelectric conversion unit 24 of the second pixel cell 32. The first pixel cell 31 and the second pixel cell 32 are thereby electrically independent, and the coming and going of charge between adjacent pixels and adjacent pixel cells is therefore limited. Color mixing in adjacent pixels and adjacent pixel cells can thereby be suppressed.

Furthermore, the insulation layer provided between the first photoelectric conversion unit 14 of the first pixel cell 31 and the second photoelectric conversion unit 24 of the second pixel cell 32 may include a black resist material. Thus, the insulation layer also functions as a light-shielding layer, and the leakage of incident light into the semiconductor substrate 2 from between the first photoelectric conversion unit 14 and the second photoelectric conversion unit 24 can therefore be reduced.

It should be noted that, in the imaging devices 100 and 100a according to the embodiment and the modified example, the first photoelectric conversion unit 14 is provided with the upper electrode 1, the photoelectric conversion layer 3, and the second electrode 12, and the second photoelectric conversion unit 24 is provided with the upper electrode 1, the photoelectric conversion layer 3, and the fourth electrode 22. However, in addition, an electron blocking layer and/or an electron hole blocking layer may be provided. Thus, the drawing out of charge from the photoelectric conversion layer 3 becomes smooth, and the photoelectric conversion rate improves. For example, in a case where electron holes are used as signal charge, an electron blocking layer can be arranged between the photoelectric conversion layer 3 and the second electrode, and an electron hole blocking layer can be arranged between the photoelectric conversion layer 3 and the upper electrode.

In the present embodiment, the first charge accumulation region 15 and the second charge accumulation region 25 are also used as drain regions for the first transistor 41A and the second transistor 41B respectively; however, the first charge accumulation region 15 and the second charge accumulation region 25 may not be used for more than one purpose. In this case, a transistor may be provided separately from these charge accumulation regions, and the first charge accumulation region 15 and the source or drain region of the transistor may be connected.

The imaging device according to the present disclosure is useful for an image sensor that is used in a camera such as a digital camera, an in-vehicle camera, and the like.

What is claimed is:
1. An imaging device, comprising:
a semiconductor substrate;
a first pixel including:
  a first photoelectric converter configured to convert incident light into charge; and
  a first diffusion region in the semiconductor substrate, configured to electrically connected to the first photoelectric converter; and
a second pixel including:
  a second photoelectric converter, configured to convert incident light into charge; and
  a second diffusion region in the semiconductor substrate, configured to electrically connected to the second photoelectric converter, wherein
an area of the first photoelectric converter is greater than an area of the second photoelectric converter in a plan view,
both the first diffusion region and the second diffusion region are directly under the first photoelectric converter in the plan view, and
neither the first diffusion region nor the second diffusion region is directly under the second photoelectric converter in the plan view.

2. The imaging device according to claim 1, wherein both an entire portion of the first diffusion region and an entire portion of the second diffusion region are directly under the first photoelectric converter in the plan view.

3. The imaging device according to claim 1, wherein the first photoelectric converter does not overlap with the second photoelectric converter.

4. The imaging device according to claim 1, wherein
the first pixel includes a third diffusion region in the semiconductor substrate and a first transistor including a first source and a first drain, the first diffusion region functioning as one of the first source and the first drain, the third diffusion region functioning as the other of the first source and the first drain,
the second pixel includes a fourth diffusion region in the semiconductor substrate and a second transistor including a second source and a second drain, the second diffusion region functioning as one of the second source and the second drain, the fourth diffusion region functioning as the other of the second source and the second drain, and
both the third diffusion region and the fourth diffusion region overlap with the first photoelectric converter in the plan view.

5. The imaging device according to claim 4, wherein neither the third diffusion region nor the fourth diffusion region overlap with the second photoelectric converter in the plan view.

6. The imaging device according to claim 4, wherein
the first transistor includes a first gate electrode,
the second transistor includes a second gate electrode, and
both the first gate electrode and the second gate electrode overlap with the first photoelectric converter.

7. The imaging device according to claim 1, wherein a distance between the first diffusion region and the second diffusion region is 0.1 µm or more.

8. An imaging device, comprising:
a semiconductor substrate;
a first pixel including:
  a first photoelectric converter configured to convert incident light into charge; and
  a first diffusion region in the semiconductor substrate, configured to electrically connected to the first photoelectric converter; and
a second pixel including:
  a second photoelectric converter configured to convert incident light into charge; and
  a second diffusion region in the semiconductor substrate, configured to electrically connected to the second photoelectric converter, wherein
an area of the first photoelectric converter is greater than an area of the second photoelectric converter in a plan view,
both the first diffusion region and the second diffusion region are directly under the first photoelectric converter in the plan view, and
the first photoelectric converter is not directly under the second photoelectric converter in the plan view.

9. The imaging device according to claim 8, wherein both an entire portion of the first diffusion region and an entire portion of the second diffusion region are directly under the first photoelectric converter in the plan view.

10. The imaging device according to claim 8, wherein
the first pixel includes a third diffusion region in the semiconductor substrate and a first transistor including a first source and a first drain, the first diffusion region functioning as one of the first source and the first drain, the third diffusion region functioning as the other of the first source and the first drain,
the second pixel includes a fourth diffusion region in the semiconductor substrate and a second transistor including a second source and a second drain, the second diffusion region functioning as one of the second source and the second drain, the fourth diffusion region functioning as the other of the second source and the second drain, and
both the third diffusion region and the fourth diffusion region overlap with the first photoelectric converter in the plan view.

11. The imaging device according to claim 10, wherein neither the third diffusion region nor the fourth diffusion region overlap with the second photoelectric converter in the plan view.

12. The imaging device according to claim 10, wherein
the first transistor includes a first gate electrode,
the second transistor includes a second gate electrode, and
both the first gate electrode and the second gate electrode overlap with the first photoelectric converter.

13. The imaging device according to claim 8, wherein a distance between the first diffusion region and the second diffusion region is 0.1 µm or more.

* * * * *